United States Patent
Daicho et al.

(10) Patent No.: US 8,299,487 B2
(45) Date of Patent: Oct. 30, 2012

(54) WHITE LIGHT EMITTING DEVICE AND VEHICLE LAMP USING THE SAME

(75) Inventors: Hisayoshi Daicho, Shizuoka (JP); Masanobu Mizuno, Shizuoka (JP); Hajime Yamamoto, Hachioji (JP); Yoshinobu Miyamoto, Hachioji (JP); Bonggoo Yun, Hachioji (JP)

(73) Assignee: Koito Manufacturing Co., Ltd., Tokyo (JP)

( * ) Notice: Subject to any disclaimer, the term of this patent is extended or adjusted under 35 U.S.C. 154(b) by 281 days.

(21) Appl. No.: 12/866,770

(22) PCT Filed: Feb. 18, 2009

(86) PCT No.: PCT/JP2009/052818
§ 371 (c)(1),
(2), (4) Date: Aug. 9, 2010

(87) PCT Pub. No.: WO2009/104651
PCT Pub. Date: Aug. 27, 2009

(65) Prior Publication Data
US 2010/0320495 A1  Dec. 23, 2010

(30) Foreign Application Priority Data
Feb. 18, 2008 (JP) ................... 2008-035453

(51) Int. Cl.
*H01L 33/00* (2010.01)

(52) U.S. Cl. ............ 257/98; 257/E33.059; 252/301.4 F

(58) Field of Classification Search ................ 257/98, 257/E33.059; 252/301.4 F
See application file for complete search history.

(56) References Cited

FOREIGN PATENT DOCUMENTS

| JP | 3503139 B2 | 12/2003 |
|---|---|---|
| JP | 2004-095480 A | 3/2004 |
| JP | 2005-281700 A | 10/2005 |
| JP | 2007-242717 A | 9/2007 |

OTHER PUBLICATIONS

International Search Report w/translation from PCT/JP2009/052818 dated Mar. 17, 2009 (5 pages).
Written Opinion from PCT/JP2009/052818 dated Mar. 17, 2009 (3 pages).
Yun, Bong-Goo et al.; "Luminescence Properties of (Sr1-uBau)Si2)2N2:Eu2+, Yellow or Orange Phosphors for White LEDS, Synthesized with (Sr1-uBau)2Si)4:Eu2+ as a Presursor"; Journal of The Electrochemical Society; Aug. 15, 2007; vol. 154, Issue 10, J320-J325 (6 pages).
Miyamoto, Kaicho et al.; "Sanchikkabutsu Aoiro Keikotai (Sr, Ba)Si2O2N2:Eu2 no Hakko Tokusei"; Extended Abstracts, 67th Autumn Meeting, The Japan Society of Applied Physics; 2006; No. 3, 1305 (1 page).

*Primary Examiner* — Matthew Reames
(74) *Attorney, Agent, or Firm* — Osha Liang LLP

(57) ABSTRACT

A white light emitting device includes a semiconductor light emitting element that has a peak of an emission spectrum in a range of 370 nm to 480 nm, and at least one kind of phosphor that is excited by light emitted from the semiconductor light emitting element to emit visible light. The phosphor is represented by the formula: $Sr_{1-x-y}Ba_xSi_2O_2N_2:Eu^{2+}_y$, wherein x is in the range of $0.3<x<1.0$, y is in the range of $0.03<y<0.3$, and x+y is in the range of $x+y<1.0$, and a vehicle lamp using the while light emitting device.

18 Claims, 6 Drawing Sheets

WHITE LIGHT EMITTING DEVICE AND VEHICLE LAMP USING THE SAME

TECHNICAL FIELD

The present invention relates to a white light emitting device used for a vehicle lamp, and a vehicle lamp using the white light emitting device. More particularly, the present invention relates to a white light emitting device capable of emitting white light, which has a high luminosity factor and is in the range of chromaticity regulations of a white light source for a vehicle lamp, at high emission intensity by using a semiconductor light emitting element and a phosphor that is efficiently excited by light emitted from the semiconductor light emitting element and emits light.

BACKGROUND ART

In recent years, the following white light emitting device has attracted attention as a white light emitting device that has long life and low power consumption. The white light emitting device is adapted to obtain white light as a composite spectrum, which is generated by additive color mixing of light obtained from a semiconductor light emitting element and a phosphor, by combining the semiconductor light emitting element, such as a laser diode (LD) or a light-emitting diode (LED) emitting blue light, with the phosphor using the semiconductor light emitting element as an excitation light source. It has been expected that the white light emitting device is used as a white light source of a vehicle lamp, particularly, a vehicle headlamp (see Patent Document 1).

Here, in accordance with chromaticity regulations, it is required that an emission spectrum of the white light source of the vehicle lamp is in a range of a predetermined chromaticity coordinates (cx,cy). For example, according to JIS: D5500, it is required that the emission spectrum of the white light source is in the range of an area A shown in a chromaticity diagram of FIG. 6.

Meanwhile, the area A is represented by the following expressions.

<Chromaticity Regulations (JIS: D5500) of White Light Source of Vehicle Headlamp>

Yellow color direction $cx \leq 0.50$

Blue color direction $cx \geq 0.31$

Green color direction $cy \leq 0.44$ and $cy \leq 0.15+0.64cx$

Violet color direction $cy \geq 0.05+0.75cx$ and $cy \geq 0.382$

As an example of a white light emitting device that can emit white light corresponding to the chromaticity regulations at high emission intensity, there is known a light emitting device that emits white light by combining an InGaN-based semiconductor light emitting element having a peak emission wavelength in a blue wavelength range (420 to 490 nm) and a cerium-activated yttrium-aluminum-garnet (YAG)-based yellow light emitting phosphor having a peak emission wavelength in the range of 510 to 600 nm (see Patent Document 2).
Patent Document 1: JP-A-2004-095480
Patent Document 2: Japanese Patent No. 3503139

DISCLOSURE OF THE INVENTION

Problems that the Invention is to Solve

Meanwhile, a chromaticity range, which can be reproduced by a white light emitting device where a semiconductor light emitting element emitting blue light is combined with a yellow phosphor, can be approximately shown by a straight line that connects the chromaticity coordinates of the blue light emitted from the semiconductor light emitting element with the chromaticity coordinates of yellow light emitted from the phosphor. It may be possible to obtain light of arbitrary chromaticity coordinates on the straight line by adjusting the emission intensities of the semiconductor light emitting element and the yellow phosphor.

A straight line L shown in a chromaticity diagram of FIG. 6 is an example of the above-mentioned straight line, and is a straight line showing a chromaticity range that can be reproduced by a white light emitting device where a blue semiconductor light emitting element having a peak emission wavelength of 450 nm is combined with a yellow phosphor having a dominant wavelength of 572 nm.

Here, a luminosity factor, which represents that human's eyes feel brightness, of yellow light is about twenty times higher than that of blue light. Accordingly, in the case of white light that is obtained from the additive color mixing of blue light and yellow light, white light having more yellow light components is felt brighter than other light by human's eyes even though white light and other light have the same emission intensity. This means that light close to the yellow phosphor is felt brighter than other light by human's eyes among light of the respective chromaticity coordinates on the straight line L if the light and other light have the same emission intensity. Further, chromaticity coordinates, which have the highest luminosity factor, in the range of the area A (the chromaticity regulations of a white light source of a vehicle lamp) become an intersection point X between a boundary of the area A facing a yellow phosphor and the straight line L.

Accordingly, in order to increase a luminosity factor in the range of the area A (chromaticity regulations of a white light source of a vehicle lamp), the color of light emitted from the semiconductor light emitting element and the color of light emitted from the phosphor need to be selected so that the coordinates of an intersection point X become closer to the yellow phosphor (X' in FIG. 6).

Specifically, if the peak emission wavelength of the semiconductor light emitting element is about 450 nm, the coordinates of the intersection point X is in the range of a high luminosity factor when a dominant wavelength of the yellow phosphor is in the range of 575 to 590 nm.

However, as for a white light emitting device, which has been known in the related art, where a semiconductor light emitting element emitting blue light is combined with a YAG-based phosphor, there has not been known a YAG-based phosphor that obtains high emission intensity when a dominant wavelength is in the range of 575 to 590 nm. For this reason, it was difficult to achieve a white light emitting device that could emit white light, which has a high luminosity factor, at high emission intensity.

The invention has been made in consideration of the above-mentioned circumstances, and an object of the invention is to provide a white light emitting device capable of emitting white light, which has a high luminosity factor and is in the range of chromaticity regulations of a white light source used in a vehicle lamp, at high emission intensity by using a semiconductor light emitting element and a phosphor that is efficiently excited by light emitted from the semiconductor light emitting element and emits light.

Means for Solving the Problems

As a result of repeated research for the solution of the above-mentioned problems, the inventors have newly found that a phosphor, represented by formula $Sr_{1-x-y}Ba_xSi_2O_2N_2$:$Eu^{2+}{}_y$, where x in the range of 0.3<x<1.0, y is in the range of 0.03<y<0.3, and x+y is in the range of x+y<1.0, is efficiently excited in the wavelength range of 370 to 480 nm and emits visible light, which includes a lot of yellow components, at high emission intensity. The inventors have finished the invention by forming a white light emitting device using the phosphor.

That is, according to a first aspect of the present invention, there is provided a white light emitting device for a vehicle lamp that includes: a semiconductor light emitting element that has a peak of an emission spectrum in a range of 370 nm to 480 nm; and at least one kind of phosphor that is excited by light emitted from the semiconductor light emitting element to emit visible light, wherein the phosphor is represented by the formula: $Sr_{1-x-y}Ba_xSi_2O_2N_2$:$Eu^{2+}{}_y$ (x is in the range of 0.3<x<1.0, y is in the range of 0.03<y<0.3, and x+y is in the range of x+y<1.0).

When x is in the range of 0.3<x<0.90, y is in the range of 0.05<y<0.25, and x+y is in the range of x+y<0.98, it is possible to provide the phosphor having a higher luminous flux.

The emission spectrum of the phosphor is not particularly limited as long as the phosphor emits visible light, in order to obtain warm white light, which has a good luminosity factor and a lower color temperature, it is preferable that a dominant wavelength of an emission spectrum of the phosphor is in the wavelength range of 567 nm to 590 nm, more preferably 575 nm to 590 nm.

It is preferable in view of color rendering that a peak wavelength of an emission spectrum of the phosphor is in the wavelength range of 540 nm to 595 nm (more preferably 575 nm to 590 nm), and a half width of the emission spectrum of the phosphor is 80 nm or more.

It is preferable that the phosphor is obtained by: primarily firing a mixture of $SrCO_3$, $BaCO_3$, $SiO_2$, and $Eu_2O_3$ under a reducing atmosphere to prepare europium-activated orthosilicate as a precursor; and secondarily firing a mixture of the precursor, $Si_3N_4$, and $NH_4Cl$ under a reducing atmosphere. The phosphor thus obtained is capable of emitting good light in a range of a green to orange color.

The peak wavelength of the semiconductor light emitting element is not particularly limited as long as the semiconductor light emitting element has a peak emission spectrum in a range of 370 nm to 480 nm. However, in view of excitation wavelength range, it is preferable that peak wavelength is in the wavelength range of 430 nm to 470 nm. It is more preferable that the semiconductor light emitting element is an InGaN-based LED having a good light emitting property in the wavelength range of about 450 nm.

According to a second aspect of the present invention, there is a vehicle lamp using the above white light emitting device as a light source.

Advantage of the Invention

The white light emitting device according to the invention can emit white light, which is suitable for the chromaticity regulated as a light source of a vehicle headlamp having a high color rendering property, at high output. Further, the same advantages are also obtained from the vehicle lamp where the white light emitting device is used as a light source.

BRIEF DESCRIPTION OF THE DRAWINGS

FIG. 4 is a chromaticity diagram showing chromaticity coordinates of the respective phosphors, reproducible chromaticity ranges of white light emitting devices using the phosphors, and the like.

FIG. 6 is a chromaticity diagram showing a reproducible chromaticity range, which can be reproduced by a white light emitting device where a semiconductor light emitting element emitting blue light is combined with a yellow phosphor, and the like.

EXPLANATION OF REFERENCE

| | |
|---|---|
| 1: | LIGHT EMITTING DEVICE |
| 2: | SUBSTRATE |
| 3a: | ELECTRODE (POSITIVE ELECTRODE) |
| 3b: | ELECTRODE (NEGATIVE ELECTRODE) |
| 4: | SEMICONDUCTOR LIGHT EMITTING ELEMENT |
| 5: | MOUNTING MEMBER |
| 6: | WIRE |
| 7: | PHOSPHOR LAYER |

BEST MODE FOR CARRYING OUT THE INVENTION

An embodiment of the invention will be described below with reference to drawings. Meanwhile, the invention is not limited to the exemplification in the following description.

Figure 1:
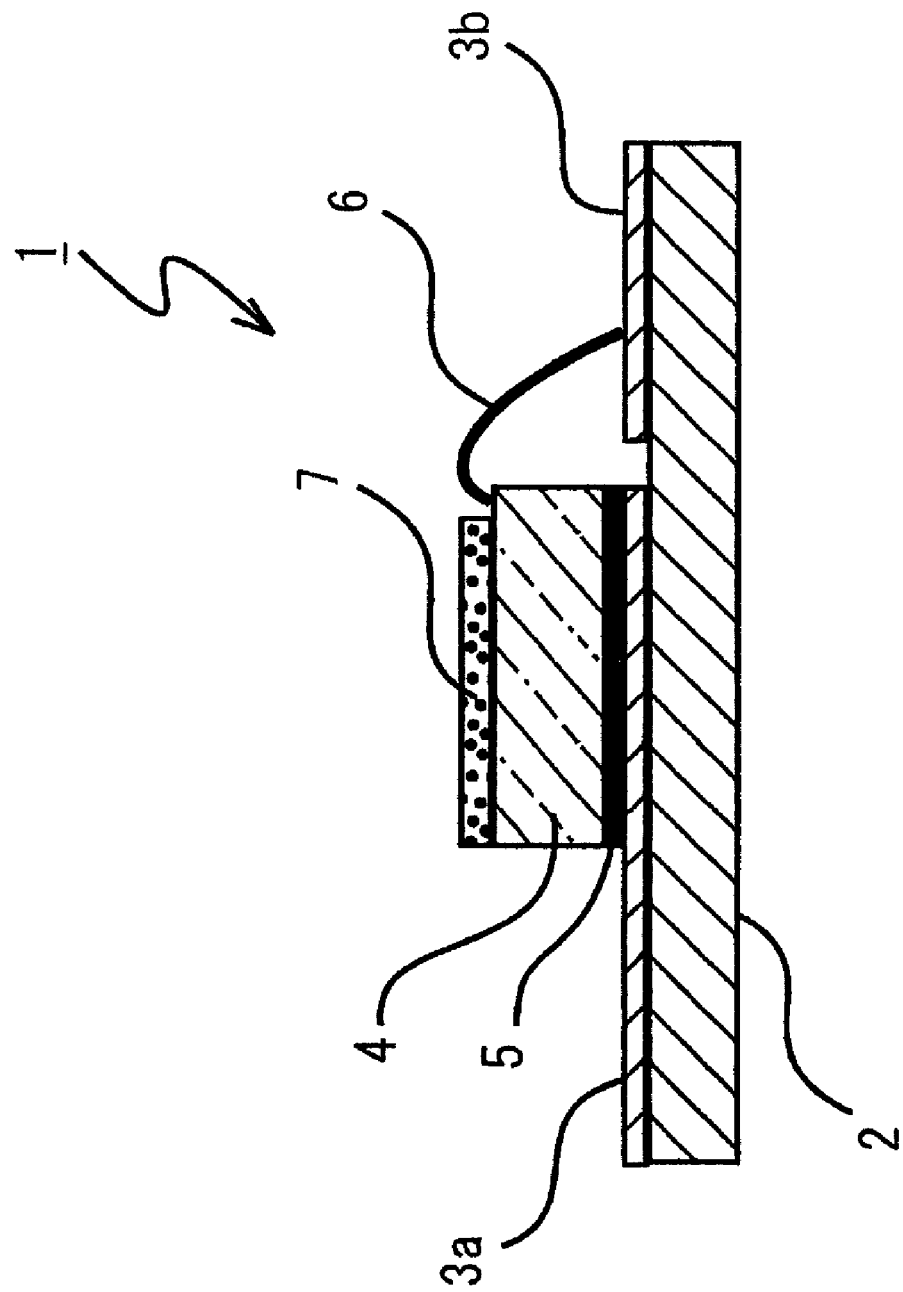
FIG. 1 is a schematic cross-sectional view of a white light emitting device 1 according to an embodiment of the invention.

FIG. 1 is a schematic cross-sectional view of a white light emitting device 1 according to an embodiment of the invention. As shown in FIG. 1, a pair of electrodes 3a and 3b (positive and negative electrodes) is formed on a substrate 2 in the white light emitting device 1. A semiconductor light emitting element 4 is fixed to the electrode 3a by a mounting member 5. The semiconductor light emitting element 4 and the electrode 3a are electrically connected to each other by the mounting member 5, and the semiconductor light emitting element 4 and the electrode 3b are electrically connected to each other by a wire 6. A phosphor layer 7 is formed on the semiconductor light emitting element.

The substrate 2 is preferably made of a material, which does not have electrical conductivity but has high thermal conductivity. For example, a ceramic substrate (an aluminum nitride substrate, an alumina substrate, a mullite substrate, and a glass ceramic substrate), a glass epoxy substrate, and the like may be used as the substrate.

Each of the electrodes 3a and 3b is a conductive layer that is made of a metal material such as gold or copper.

The semiconductor light emitting element 4 is an example of a light emitting element that is used in the white light emitting device according to the embodiment of the invention. For example, an LED, an LD, or the like, which emits ultraviolet light or short-wavelength visible light, may be used as the semiconductor light emitting element. Specifically, examples of the semiconductor light emitting element may include an InGaN-based compound semiconductor. An emission wavelength range of the InGaN-based compound semiconductor varies depending on the content of In. The emission wavelength tends to become a long wavelength if the content of In is large, and tends to become a short wavelength if the content of In is small.

For example, the mounting member 5 is gold-tin eutectic solder or a conductive adhesive such as a silver paste. The mounting member fixes the lower surface of the semiconductor light emitting element 4 to the electrode 3a, and electrically connects the electrode formed on the lower surface of the semiconductor light emitting element 4 with the electrode 3a formed on the substrate 2.

The wire 6 is a conductive member such as a gold wire. For example, the wire is bonded to the electrode 3b and an electrode, which is formed on the upper surface of the semiconductor light emitting element 4, by ultrasonic thermo-compression bonding or the like, and electrically connects the electrode 3b with the electrode formed on the upper surface of the semiconductor light emitting element.

Phosphors to be described below are sealed in the phosphor layer 7 in the shape of a film that covers the upper surface of the semiconductor light emitting element 4 by a binder member. The phosphor layer 7 may be formed by preparing a phosphor paste where phosphors are mixed in, for example, a liquid or gel-like binder member, applying the phosphor paste on the upper surface of the semiconductor light emitting element 4, and then hardening the binder member of the applied phosphor paste. For example, a silicon resin, a fluorine resin, or the like may be used as the binder member.

The phosphor, which is used in the white light emitting device according to the embodiment of the invention, is a phosphor that is represented by a formula of "$Sr_{1-x-y}Ba_xSi_2O_2N_2:Eu^{2+}_y$," (wherein, x satisfies $0.3<x<1.0$, y satisfies $0.03<y<0.3$, and x+y satisfies $x+y<1.0$). For example, it may be possible to obtain the phosphor as follows:

Europium-activated orthosilicate is prepared as a precursor by firing the mixture of powder of $SrCO_3$, $BaCO_3$, $SiO_2$, and $Eu_2O_3$ in a reducing atmosphere. It may be possible to obtain a phosphor of the invention by pulverizing the precursor, adding $Si_3N_4$ and $NH_4Cl$ to the precursor, and firing the precursor in a reducing atmosphere.

One or several kinds of phosphors, which have light-emitting characteristics different from those of the phosphor, may be mixed in the phosphor layer 7. It may be possible to adjust the chromaticity of the white light, which is obtained from the white light emitting device, by changing the amount of mixed phosphors.

Materials, which have various properties, other than the phosphors may be mixed in the phosphor layer 7. It may be possible to increase the refractive index of the phosphor layer 7 by mixing a material of which the refractive index is higher than that of the binder member, for example, a metal oxide, a fluorine compound, sulfide, or the like in the phosphor layer 7. Accordingly, total reflection, which occurs when light emitted from the semiconductor light emitting element 4 enters the phosphor layer 7, is reduced, so that it may be possible to obtain an advantage of improving the efficiency of excitation light that enters the phosphor layer 7. In addition, if the particle size of the material to be mixed is set to nanosize, it may be possible to increase the refractive index without the decrease of the transparency of the phosphor layer 7.

Further, white powder, which has an average particle size of about 0.3 to 2 μm (which is equal to an average particle size of alumina, zirconia, a titanium oxide, or the like), may be mixed in the phosphor layer 7 as a light scattering agent. Accordingly, it may be possible to prevent unevenness in brightness and chromaticity on the light emitting surface.

If drive current is applied to the electrodes 3a and 3b of the white light emitting device 1, current flows in the semiconductor light emitting element 4. Accordingly, the semiconductor light emitting element 4 emits light, which corresponds to a specific wavelength range including blue light, toward the phosphor layer 7. A part of the light is used for the excitation of the phosphors in the phosphor layer 7. The other of the lights is transmitted through the phosphor layer 7 and is emitted to the outside as it is. The phosphors are excited by the light that is emitted from the semiconductor light emitting element 4, and emits the light corresponding to the specific wavelength range. It may be possible to obtain white light by the additive color mixing of the light, which is emitted from the semiconductor light emitting element 4 and is transmitted through the phosphor layer 7, and the light that is emitted from the phosphors.

EXAMPLES

The white light emitting device 1 will be described in more detail below using examples of the light emitting device. Meanwhile, the description of raw materials of the light emitting device, a method of manufacturing the light emitting device, the chemical composition of the phosphors, and the like does not limit the invention at all.

First, phosphors, which are used for a light emitting device according to an example, will be described in detail.

<Phosphor 1>

Phosphor represented by $Sr_{0.425}Ba_{0.425}Si_2O_2N_2:Eu^{2+}_{0.15}$.

In the manufacture of Phosphor 1, first, 1.321 g of $SrCO_3$, 1.766 g of $BaCO_3$, 0.556 g of $Eu_2O_3$, and 0.632 g of $SiO_2$ were weighed, respectively. The respective raw materials were put in an alumina mortar and were mixed and pulverized for about 20 minutes. The mixture of the raw materials was put in an alumina crucible, and the alumina crucible was covered with a lid. Then, the mixture was fired for 3 hours under a reducing atmosphere of $H_2/N_2$ (5/95) by an electric furnace of 1100° C. As a result, a precursor represented by $Sr_{0.85}Ba_{0.85}SiO_4:Eu^{2+}_{0.30}$ was obtained.

After that, 3.289 g of the precursor, 1.403 g of $Si_3N_4$, and 0.047 g of $NH_4Cl$ as flux were weighed, respectively. The respective raw materials were put in an alumina mortar and were mixed and pulverized for about 20 minutes. The mixture of the raw materials was put in an alumina crucible, and the alumina crucible was covered with a lid. Then, the mixture was fired for 6 hours under a reducing atmosphere of $H_2/N_2$ (5/95) at a temperature of 1200 to 1400° C. As a result, Precursor 1 was obtained.

<Phosphor 2>

Phosphor represented by $Sr_{0.05}Ba_{0.75}Si_2O_2N_2:Eu^{2+}_{0.2}$.

In the manufacture of Phosphor 2, first, 0.114 g of $SrCO_3$, 2.277 g of $BaCO_3$, 0.541 g of $Eu_2O_3$, and 0.462 g of $SiO_2$ were weighed, respectively. The respective raw materials were put in an alumina mortar and were mixed and pulverized for about 20 minutes. The mixture of the raw materials was put in an alumina crucible, and the alumina crucible was covered with a lid. Then, the mixture was fired for 3 hours under a reducing atmosphere of $H_2/N_2$ (5/95) by an electric furnace of 1100° C. As a result, a precursor represented by $Sr_{0.1}Ba_{1.5}SiO_4:Eu^{2+}_{0.4}$ was obtained.

After that, 2.451 g of the precursor, 0.935 g of $Si_3N_4$, and 0.034 g of $NH_4Cl$ as flux were weighed, respectively. The respective raw materials were put in an alumina mortar and were mixed and pulverized for about 20 minutes. The mixture of the raw materials was put in an alumina crucible, and the alumina crucible was covered with a lid. Then, the mixture was fired for 6 hours under a reducing atmosphere of $H_2/N_2$ (5/95) at a temperature of 1200 to 1400° C. As a result, Precursor 2 was obtained.

<Phosphor 3>

Phosphor represented by $Sr_{0.225}Ba_{0.675}Si_2O_2N_2:Eu^{2+}_{0.1}$.

In the manufacture of Phosphor 3, first, 0.511 g of $SrCO_3$, 2.049 g of $BaCO_3$, 0.271 g of $Eu_2O_3$, and 0.462 g of $SiO_2$ were weighed, respectively. The respective raw materials were put in an alumina mortar and were mixed and pulverized for about 20 minutes. The mixture of the raw materials was put in an alumina crucible, and the alumina crucible was covered with a lid. Then, the mixture was fired for 3 hours under a reducing atmosphere of $H_2/N_2$ (5/95) by an electric furnace of 1100° C. As a result, a precursor represented by $Sr_{0.45}Ba_{1.35}SiO_4:Eu^{2+}_{0.2}$ was obtained.

After that, 2.315 g of the precursor, 0.935 g of $Si_3N_4$, and 0.03 g of $NH_4Cl$ as flux were weighed, respectively. The respective raw materials were put in an alumina mortar and were mixed and pulverized for about 20 minutes. The mixture of the raw materials was put in an alumina crucible, and the alumina crucible was covered with a lid. Then, the mixture was fired for 6 hours under a reducing atmosphere of $H_2/N_2$ (5/95) at a temperature of 1200 to 1400° C. As a result, Precursor 3 was obtained.

<Referential Phosphor 1>

A phosphor represented by $Sr_{0.93}Si_2O_2N_2:Eu^{2+}_{0.07}$ was prepared as Referential phosphor 1.

In the manufacture of Referential phosphor 1, first, 3.051 g of $SrCO_3$, 0.274 g of $Eu_2O_3$, and 0.668 g of $SiO_2$ were weighed, respectively. The respective raw materials were put in an alumina mortar and were mixed and pulverized for about 20 minutes. The mixture of the raw materials was put in an alumina crucible, and the alumina crucible was covered with a lid. Then, the mixture was fired for 3 hours under a reducing atmosphere of $H_2/N_2$ (5/95) by an electric furnace of 1100° C. As a result, a precursor represented by $Sr_{1.86}SiO_4:Eu^{2+}_{0.14}$ was obtained.

After that, 2.763 g of the precursor, 1.402 g of $Si_3N_4$, and 0.04 g of $NH_4Cl$ as flux were weighed, respectively. The respective raw materials were put in an alumina mortar and were mixed and pulverized for about 20 minutes. The mixture of the raw materials was put in an alumina crucible, and the alumina crucible was covered with a lid. Then, the mixture was fired for 6 hours under a reducing atmosphere of $H_2/N_2$ (5/95) at a temperature of 1200 to 1400° C. As a result, Referential phosphor 1 was obtained.

<Referential Phosphor 2>

A phosphor represented by $Sr_{0.67}Ba_{0.25}Si_2O_2N_2:Eu^{2+}_{0.08}$ was prepared as Referential phosphor 2.

In the manufacture of Referential phosphor 2, first, 1.517 g of $SrCO_3$, 0.759 g of $BaCO_3$, 0.217 g of $Eu_2O_3$, and 0.462 g of $SiO_2$ were weighed, respectively. The respective raw materials were put in an alumina mortar and were mixed and pulverized for about 20 minutes. The mixture of the raw materials was put in an alumina crucible, and the alumina crucible was covered with a lid. Then, the mixture was fired for 3 hours under a reducing atmosphere of $H_2/N_2$ (5/95) by an electric furnace of 1100° C. As a result, a precursor represented by $Sr_{1.34}Ba_{0.5}SiO_4:Eu^{2+}_{0.16}$ was obtained.

After that, 2.016 g of the precursor, 0.935 g of $Si_3N_4$, and 0.03 g of $NH_4Cl$ as flux were weighed, respectively. The respective raw materials were put in an alumina mortar and were mixed and pulverized for about 20 minutes. The mixture of the raw materials was put in an alumina crucible, and the alumina crucible was covered with a lid. Then, the mixture was fired for 6 hours under a reducing atmosphere of $H_2/N_2$ (5/95) at a temperature of 1200 to 1400° C. As a result, Referential phosphor 2 was obtained.

<Comparative Phosphor 1>

A cerium-activated yttrium-aluminum-garnet phosphor (P46-Y3 manufactured by Kasei Optonix Co., Ltd.) was used as Comparative phosphor 1.

As an example of a white light emitting device that could emit white light corresponding to chromaticity regulations at high emission intensity, there was known a light emitting device that could emit white light by combining an InGaN-based semiconductor light emitting element with a cerium-activated yttrium-aluminum-garnet (YAG)-based yellow phosphor. The InGaN-based semiconductor light emitting element has a peak emission wavelength in a blue wavelength range (420 to 490 nm). The cerium-activated yttrium-aluminum-garnet (YAG)-based yellow phosphor has a peak emission wavelength in the range of 510 to 600 nm.

This phosphor is known as a phosphor that is excited by light corresponding to a blue wavelength range and emits yellow light.

<Evaluation Results of Phosphors 1 to 3>

Various light-emitting characteristics of Phosphors 1 to 3, Referential phosphors 1 and 2, and Comparative phosphor 1, which have been measured under the excitation using light corresponding to a wavelength of 450 nm, will be described below.

Table 1 shows the integrated emission intensity ratios, the chromaticity coordinates (cx,cy), and the dominant wavelengths (nm) of the respective phosphors under the excitation using light that corresponds to a wavelength of 450 nm.

Meanwhile, an integrated emission intensity ratio is represented as a relative value when the integrated emission intensity of Comparative phosphor 1 under the excitation using light corresponding to a wavelength of 450 nm is defined as 100.

TABLE 1

|  | Integrated emission intensity ratio | Chromaticity coordinates (cx, cy) | Dominant wavelength (nm) |
| --- | --- | --- | --- |
| Phosphor 1 | 121 | 0.47, 0.51 | 575 |
| Phosphor 2 | 114 | 0.52, 0.47 | 581 |
| Phosphor 3 | 108 | 0.47, 0.51 | 575 |
| Referential phosphor 1 | 102 | 0.37, 0.60 | 560 |
| Referential phosphor 2 | 118 | 0.40, 0.57 | 565 |
| Comparative phosphor 1 | 100 | 0.45, 0.53 | 572 |

Integrated emission intensity ratio: a relative value when the integrated emission intensity of Comparative phosphor 1 is defined as 100.

From Table 1, it is found that all of Phosphors 1 to 3 have integrated emission intensities higher than the integrated emission intensity of Comparative phosphor 1, are efficiently excited in a wavelength range near a wavelength of 450 nm, and can emit visible light having high emission intensity.

Further, it is found that the chromaticity coordinates of Phosphors 1 to 3, that is, cx is in the range of 0.47 to 0.52 and cy is in the range of 0.47 to 0.51 and the dominant wavelengths of Phosphors 1 to 3 are in the range of 575 to 581 nm where the dominant wavelengths of Phosphors 1 to 3 become longer than the dominant wavelength of Comparative phosphor 1.

Figure 2:
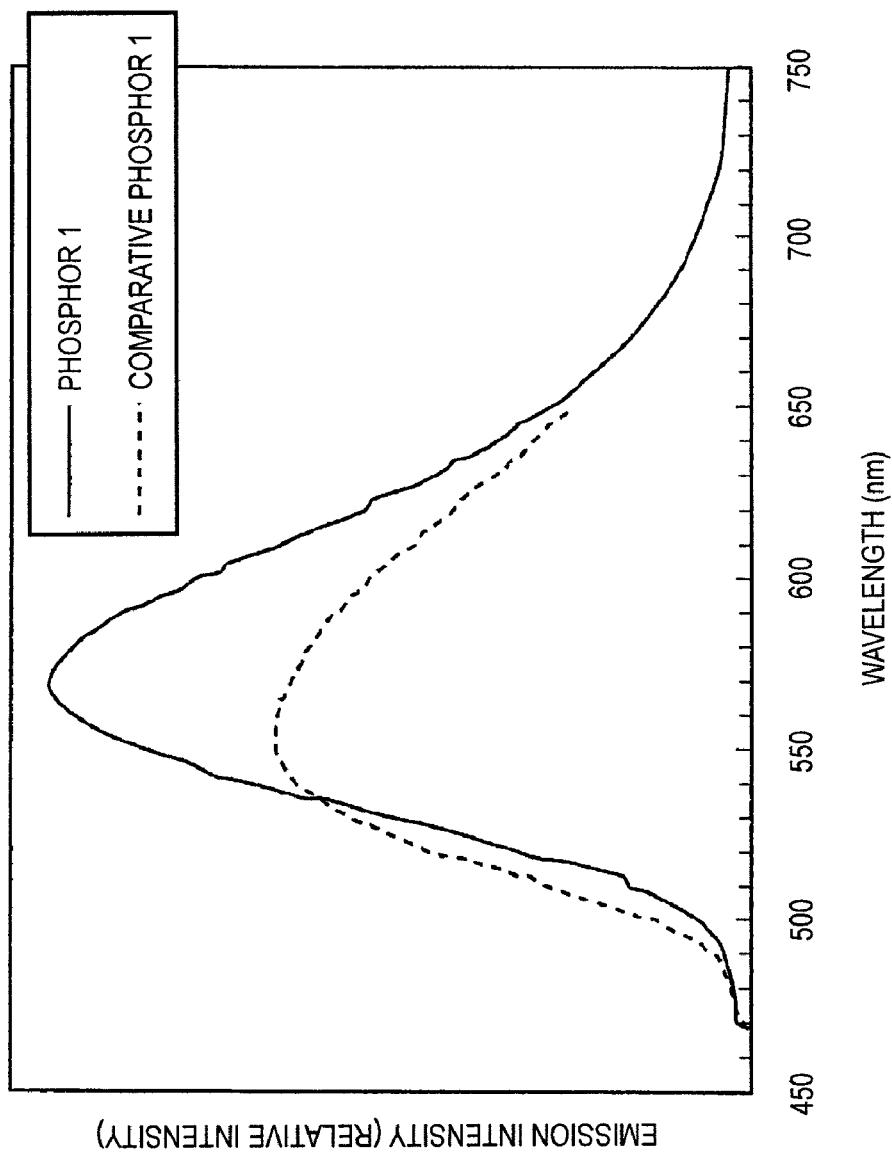
FIG. 2 is a view showing an emission spectrum (solid line) of Phosphor 1 and an emission spectrum (dotted line) of Comparative phosphor 1.

FIG. 2 shows an emission spectrum (solid line) of Phosphor 1 and an emission spectrum (dotted line) of Comparative phosphor 1 under the excitation using light that corresponds to a wavelength of 450 nm.

Meanwhile, a vertical axis of a graph of FIG. 2 represents relative emission intensity between Phosphor 1 and Comparative phosphor 1.

From FIG. 2, it is found that a half width is 90 nm or more since a peak of the emission spectrum of Phosphor 1 is in the wavelength range of 560 to 580 nm. From this, it is found that Phosphor 1 emits light corresponding to a yellow color that is a complementary color of a blue color.

Figure 3:
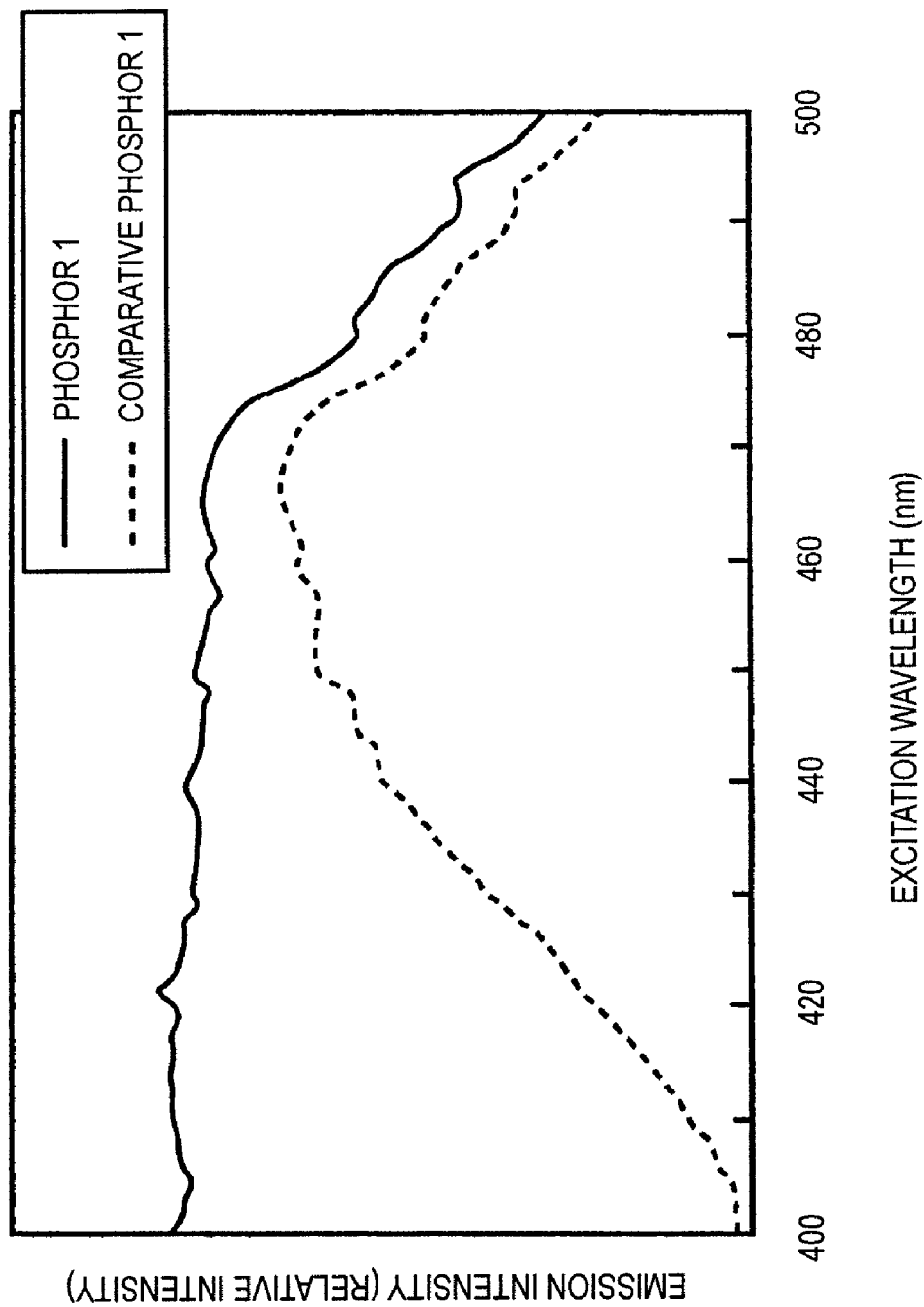
FIG. 3 is a view showing an excitation spectrum (solid line) of Phosphor 1 and an excitation spectrum (dotted line) of Comparative phosphor 1.

FIG. 3 shows an excitation spectrum (solid line) of Phosphor 1 and an excitation spectrum (dotted line) of Comparative phosphor 1.

Meanwhile, a vertical axis of a graph of FIG. 3 represents relative excitation intensity between Phosphor 1 and Comparative phosphor 1.

From FIG. 3, it is found that peaks of the excitation spectrum of Phosphor 1 broadly exist in the range of 400 to 470 nm.

From this, it is found that Phosphor 1 is efficiently excited by light emitted from a semiconductor light emitting element having a peak of the emission spectrum in the wavelength range of 370 to 480 nm and can emit light.

<Examination of Change of Light to White Light by Additive Color Mixing>

Figure 4:
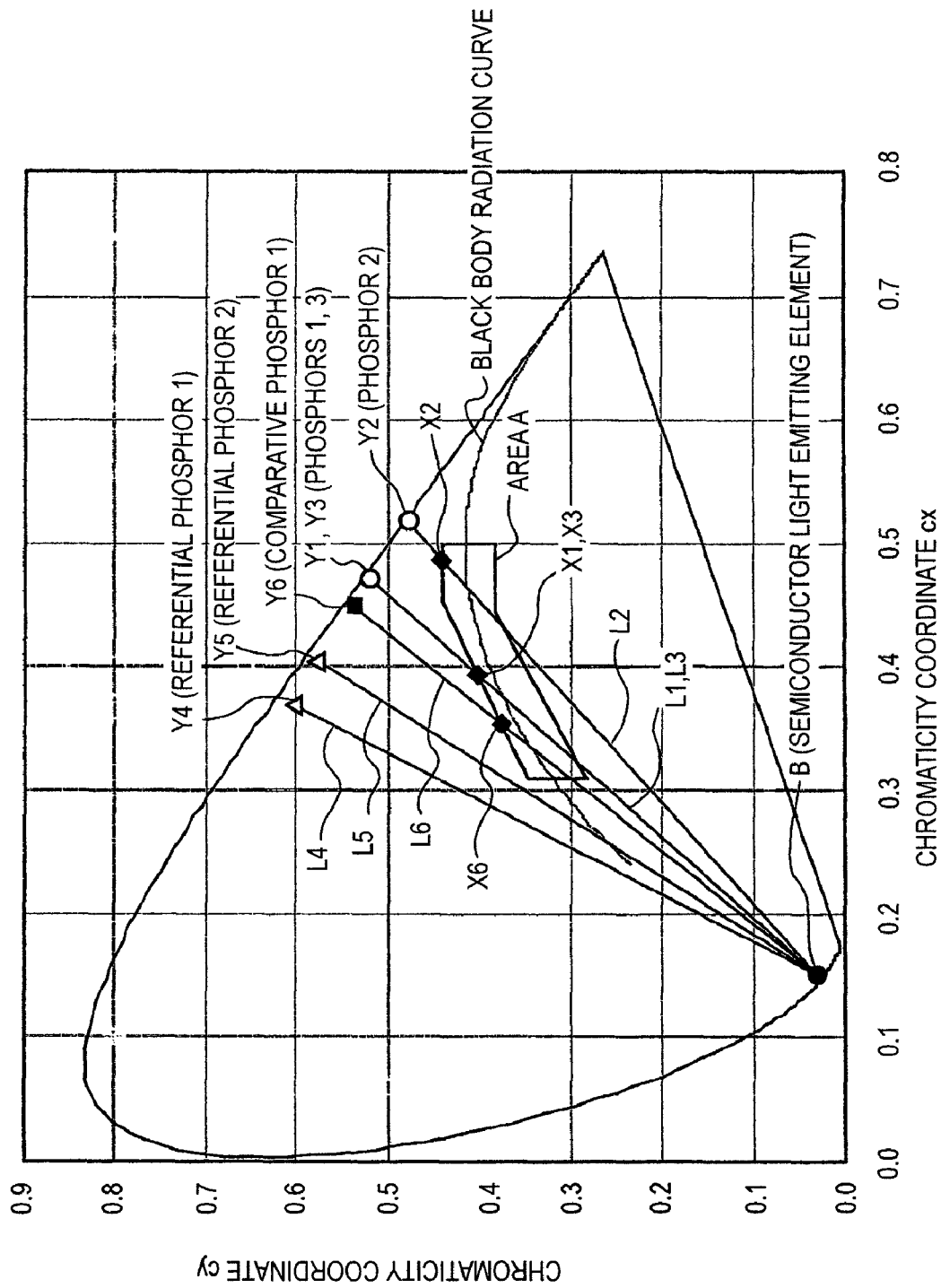
Figure 5:
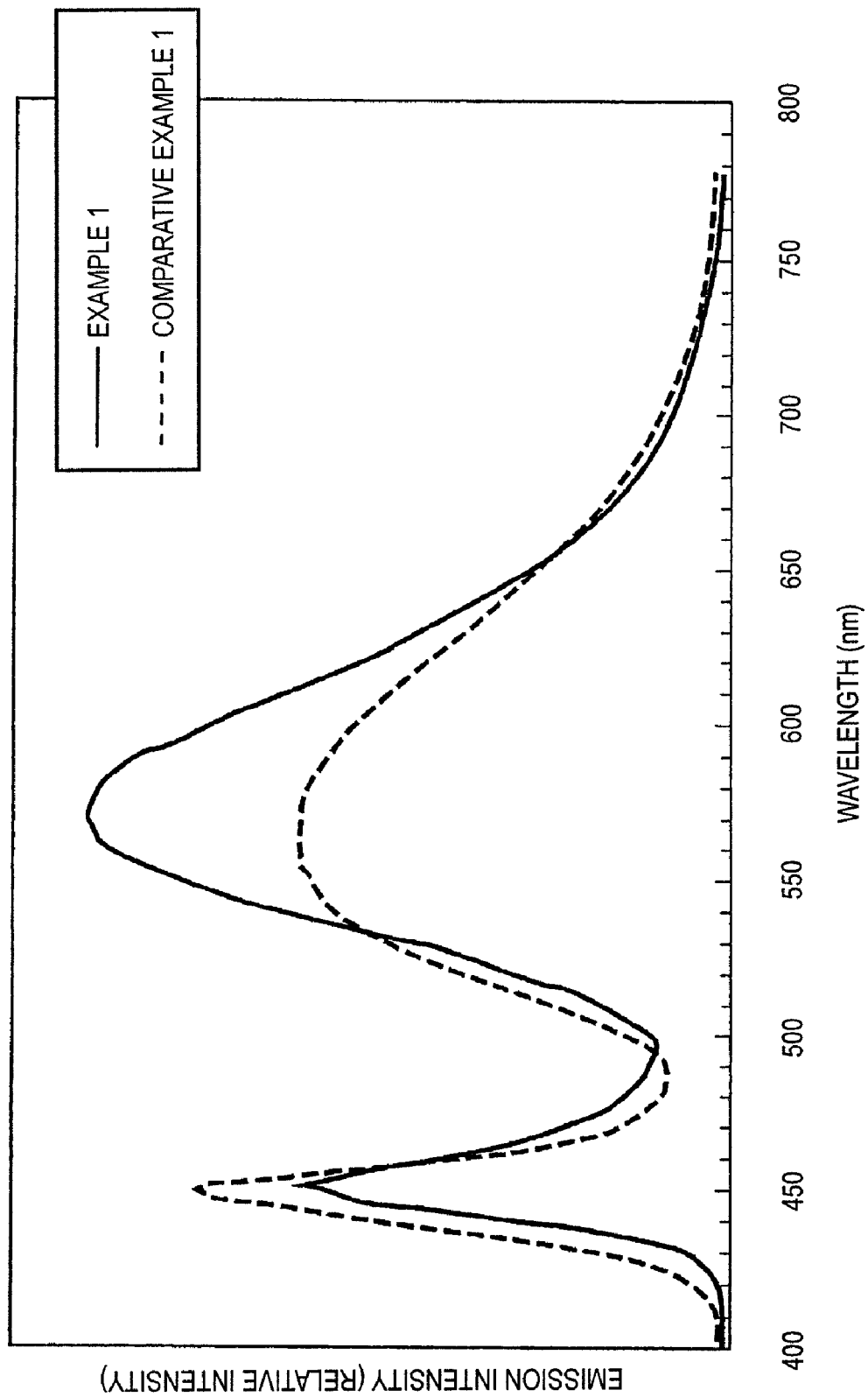
FIG. 5 is a view showing an emission spectrum (solid line) of Example 1 of the invention and an emission spectrum (dotted line) of Comparative example 1.
Figure 6:
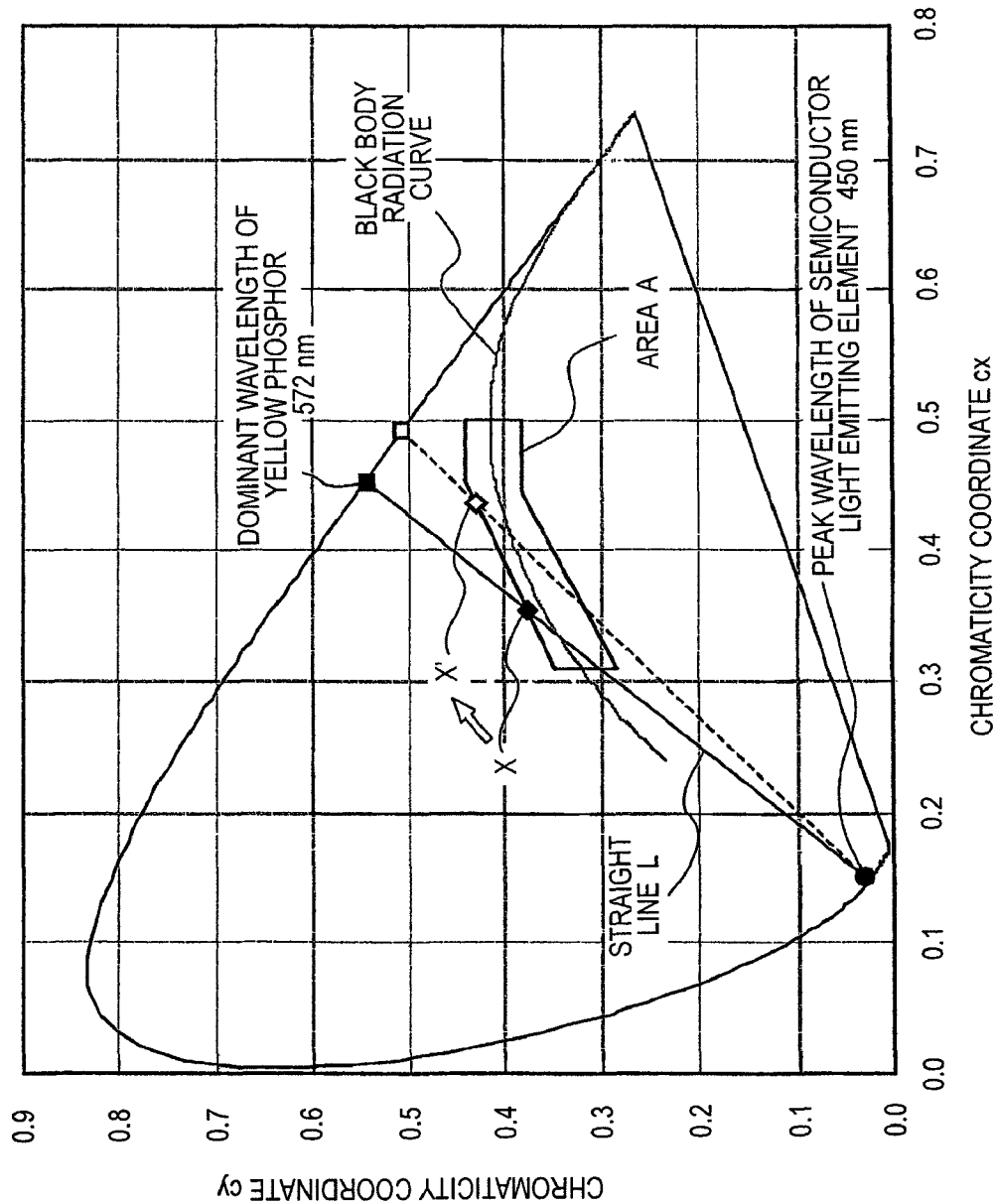

As shown in FIG. 4, the chromaticity range, which can be reproduced by the additive color mixing of each phosphor and the semiconductor light emitting element whose peak wavelength of the emission spectrum is 450 nm, can be approximately shown by straight lines (dotted lines) L1 to L6 that connect a chromaticity coordinate point B (cx=0.152 and cy=0.025) of the semiconductor light emitting element with points Y1 to Y6 that are chromaticity coordinates of the respective phosphors shown in Table 1.

From FIG. 4, the following is expected. That is, since the straight lines L1 to L3 (Phosphors 1 to 3) and L6 (Comparative phosphor 1) pass through the range of an area A representing the range of the chromaticity regulations (JIS:D5500) of a white light source of a vehicle headlamp, Phosphors 1 to 3 and Comparative phosphor 1 can emit white light, which satisfies the chromaticity regulations, by being combined with a semiconductor light emitting element emitting blue light.

Meanwhile, it is expected that Referential phosphors 1 and 2 cannot emit white light satisfying the chromaticity regulations since the straight lines L4 and L5 do not pass through the range of the area A.

Further, as described above, points, which have the highest luminosity factor, on the straight lines L1 to L3 (Phosphors 1 to 3) or the straight line L6 (Comparative phosphor 1) in the range of the area A become points X1 to 3 and X6 that are intersection points between a boundary of the area A corresponding to a yellow phosphor and the respective straight lines L1 to L3 and L6.

Table 2 shows the chromaticity coordinates of the points X1 to 3 and X6, color differences α (color differences between the respective points and the chromaticity coordinate (point B) of the semiconductor light emitting element), color differences β (color differences (color differences β) between the respective points and the chromaticity coordinates (points Y1 to Y3 and Y6) of the respective phosphors), and color difference ratios (color difference a:color difference β).

From Table 2 and FIG. 4, it is found that a ratio of the color difference α to the color difference β of each of the points X1 to X3 (Phosphors 1 to 3) is larger than that of the point X6 (Comparative phosphor 1) and the points X1 to X3 (Phosphors 1 to 3) are close to the chromaticity coordinates of the phosphors. From this, the following is expected. That is, if Phosphors 1 to 3 are combined with the semiconductor light emitting element emitting blue light, it may be possible to emit white light having a luminosity factor higher than a luminosity factor when Comparative phosphor 1 is used in the range of the area A.

TABLE 2

| Intersection point with each phosphor | Chromaticity coordinates (cx, cy) | Color difference α | Color difference β | Color difference ratio (color difference α:color difference β) |
| --- | --- | --- | --- | --- |
| X1 (Phosphor 1) | 0.405, 0.409 | 0.299 | 0.125 | 70.5:29.5 |
| X2 (Phosphor 2) | 0.494, 0.440 | 0.392 | 0.041 | 90.5:9.5 |
| X3 (Phosphor 3) | 0.392, 0.406 | 0.287 | 0.134 | 69.8:32.6 |
| X6 (Comparative phosphor 1) | 0.385, 0.383 | 0.252 | 0.170 | 59.7:40.3 |

Color difference α: color differences between points X1 to X3 and x6 and the chromaticity coordinate (point B) of a semiconductor light emitting element
Color difference β: color differences between points X1 to X3 and X6 and the respective phosphors (points Y1 to Y3 and Y6)

The structure of a light emitting device according to an example will be described in detail below.

Meanwhile, the structure of the following light emitting device is common to all examples and comparative examples except for the kind of a phosphor to be used.

<Structure of Light Emitting Device>

A light emitting device according to an example is formed by using the following specific structure in the above-mentioned embodiment.

First, an aluminum nitride substrate was used as the substrate 2, and the electrode 3a (positive electrode) and the electrode 3b (negative electrode) were made of gold on the surface of the substrate.

Further, a LED (MvpLEDTMSL-V-B40AC manufactured by SemiLEDs Corporation), which has a size of 1 mm square and an emission peak at 450 nm, was used as the semiconductor light emitting element 4. Furthermore, the lower surface of the LED was bonded to a silver paste (trade name: 84-1LMISR4, manufactured by Ablestik Laboratories), which was dropped onto the electrode 3a (positive electrode) by a dispenser, and the silver paste was hardened for one hour at a temperature of 175° C.

Moreover, a gold wire having a diameter φ of 45 μm was used as the wire 6, and the gold wire was bonded to the electrode formed on the upper surface of the LED and the electrode 3b (negative electrode) by ultrasonic thermo-compression bonding.

In addition, a silicon resin (trade name: JCR6140, manufactured by Dow Corning Toray Silicone Co., Ltd.) was used as the binder member, a phosphor paste was prepared by mixing 30 vol % of a mixture of various phosphors in the silicon resin, and the phosphor paste was applied to the upper surface of the semiconductor light emitting element 4. The phosphor paste was applied while the thickness of the phosphor paste to be applied is adjusted so that desired chromaticity was obtained.

The applied phosphor paste was hardened stepwise, that is, hardened for 40 minutes at a temperature of 80° C. and then hardened for 60 minutes at a temperature of 150° C. As a result, the phosphor layer 7 was formed.

The following examples, referential examples, and comparative examples were prepared on the basis of the structure of the above-mentioned phosphor and light emitting device.

Example 1

In Example 1, a phosphor paste was prepared using the above-mentioned Phosphor 1, and a light emitting device, where the amount of the applied phosphor paste was adjusted so as to be close to the point X1 in the chromaticity diagram of FIG. 4, was prepared using the phosphor paste.

Example 2

In Example 2, a phosphor paste was prepared using the above-mentioned Phosphor 2, and a light emitting device, where the amount of the applied phosphor paste was adjusted so as to be close to the point X2 in the chromaticity diagram of FIG. 4, was prepared using the phosphor paste.

Example 3

In Example 3, a phosphor paste was prepared using the above-mentioned Phosphor 3, and a light emitting device, where the amount of the applied phosphor paste was adjusted so as to be close to the point X3 in the chromaticity diagram of FIG. 4, was prepared using the phosphor paste.

Comparative Example 1

In Comparative example 1, a phosphor paste was prepared using the above-mentioned Comparative phosphor 1, and a light emitting device, where the amount of the applied phosphor paste was adjusted so as to be close to the point X6 in the chromaticity diagram of FIG. 4, was prepared using the phosphor paste.

Evaluation of Example

Current of 50 mA was supplied to each of the light emitting devices in an integrating sphere to make each of the light emitting devices emit light, and luminous flux and spectrum of the light emitted from each of the light emitting devices were measured by a spectroscope (trade name: CAS140B-152, manufactured by Instrument Systems). The results of the measurement will be described in detail below.

Table 3 shows a luminous flux ratio, chromaticity coordinates (cx,cy), and color temperature (K) when drive current of 50 mA has been applied to each light emitting device.

Meanwhile, a luminous flux ratio is indicated as a relative value assuming that luminous flux, when drive current of 50 mA has been applied to the light emitting device according to Comparative example 1, is 100.

TABLE 3

| | Luminous flux ratio | Chromaticity coordinates (cx, cy) | Color temperature (K) |
|---|---|---|---|
| Example 1 | 131 | 0.409, 0.415 | 3794 |
| Example 2 | 101 | 0.488, 0.429 | 2487 |
| Example 3 | 109 | 0.408, 0.414 | 3799 |
| Comparative example 1 | 100 | 0.364, 0.377 | 4460 |

Luminous flux ratio: a relative value assuming that luminous flux, when drive current of 50 mA has been applied to the light emitting device according to Comparative example 3, is 100.

From Table 3, it is found that the luminous flux of each of all Examples is higher than that of Comparative example 1.

Further, it is found that the chromaticity coordinates of all Examples are in the range of the area A in the chromaticity diagram of FIG. 4, that is, light is white light corresponding to the chromaticity regulations of a white light source of a vehicle lamp, and the chromaticity coordinates of Comparative example 1 are at positions close to the phosphor, that is, light is white light having a high luminosity factor.

Furthermore, it is found that the color temperature of Comparative example 1 is equal to or higher than 4000 K but the color temperature of each of Examples 1 to 3 corresponds to a warm color equal to or lower than 4000 K.

The phosphor according to the invention has been described above with reference to examples. However, the invention is not limited to these examples, and it goes without saying that various modifications, improvements, combinations, application forms, and the like may be considered.

This application is based on Japanese Patent Application No. 2008-035453, filed on Feb. 18, 2008, the contents of which are incorporated herein by reference.

INDUSTRIAL APPLICABILITY

The white light emitting device according to the invention may be used for a vehicle lamp of which a function color of a light source is white, for example, a headlamp, a fog lamp, a cornering lamp, a license plate lamp, a backup lamp, a room lamp, and the like.

Further, the white light emitting device according to the invention may be used for a vehicle lamp, where a white light source, a color filter, and the like are combined, of which a function color is a color except for white, for example, a taillamp, a stop lamp, a turn signal lamp, and the like.

The invention claimed is:

1. A white light emitting device for a vehicle lamp, the white light emitting device comprising:
    a semiconductor light emitting element that has a peak of an emission spectrum in a range of 370 nm to 480 nm; and
    at least one kind of phosphor that is excited by light emitted from the semiconductor light emitting element to emit visible light, wherein the phosphor is represented by the formula:

$Sr_{1-x-y}Ba_xSi_2O_2N_2:Eu^{2+}_y$ wherein x is in the range of 0.3<x<1.0, y is in the range of 0.03<y<0.3, and x+y is in the range of x+y<1.0.
2. The white light emitting device according to claim 1, wherein x is in the range of 0.3<x<0.90, y is in the range of 0.05<y<0.25, and x+y is in the range of x+y<0.98.
3. The white light emitting device according to claim 1, wherein a dominant wavelength of an emission spectrum of the phosphor is in the wavelength range of 567 nm to 590 nm.
4. The white light emitting device according to claim 3, wherein a dominant wavelength of an emission spectrum of the phosphor is in the wavelength range of 575 nm to 590 nm.
5. The white light emitting device according to claim 1, wherein a peak wavelength of an emission spectrum of the phosphor is in the wavelength range of 540 nm to 595 nm, and a half width of the emission spectrum of the phosphor is 80 nm or more.
6. The white light emitting device according to claim 5, wherein a peak wavelength of an emission spectrum of the phosphor is in the wavelength range of 575 nm to 590 nm.
7. The white light emitting device according to claim 1, wherein the phosphor is obtained by:
    primarily firing a mixture of $SrCO_3$, $BaCO_3$, $SiO_2$, and $Eu_2O_3$ under a reducing atmosphere to prepare europium-activated orthosilicate as a precursor; and
    secondarily firing a mixture of the precursor, $Si_3N_4$, and $NH_4Cl$ under a reducing atmosphere.

8. The white light emitting device according to claim 1, wherein the semiconductor light emitting element is an InGaN-based LED whose peak wavelength is in the wavelength range of 430 nm to 470 nm.

9. A vehicle lamp comprising the white light emitting device according to claim 1 as a light source.

10. The white light emitting device according to claim 2, wherein a dominant wavelength of an emission spectrum of the phosphor is in the wavelength range of 567 nm to 590 nm.

11. The white light emitting device according to claim 2, wherein a peak wavelength of an emission spectrum of the phosphor is in the wavelength range of 540 nm to 595 nm, and a half width of the emission spectrum of the phosphor is 80 nm or more.

12. The white light emitting device according to claim 3, wherein a peak wavelength of an emission spectrum of the phosphor is in the wavelength range of 540 nm to 595 nm, and a half width of the emission spectrum of the phosphor is 80 nm or more.

13. The white light emitting device according to claim 4, wherein a peak wavelength of an emission spectrum of the phosphor is in the wavelength range of 540 nm to 595 nm, and a half width of the emission spectrum of the phosphor is 80 nm or more.

14. The white light emitting device according to claim 2, wherein the phosphor is obtained by:
    primarily firing a mixture of $SrCO_3$, $BaCO_3$, $SiO_2$, and $Eu_2O_3$ under a reducing atmosphere to prepare europium-activated orthosilicate as a precursor; and
    secondarily firing a mixture of the precursor, $Si_3N_4$, and $NH_4Cl$ under a reducing atmosphere.

15. The white light emitting device according to claim 3, wherein the phosphor is obtained by:
    primarily firing a mixture of $SrCO_3$, $BaCO_3$, $SiO_2$, and $Eu_2O_3$ under a reducing atmosphere to prepare europium-activated orthosilicate as a precursor; and
    secondarily firing a mixture of the precursor, $Si_3N_4$, and $NH_4Cl$ under a reducing atmosphere.

16. The white light emitting device according to claim 4, wherein the phosphor is obtained by:
    primarily firing a mixture of $SrCO_3$, $BaCO_3$, $SiO_2$, and $Eu_2O_3$ under a reducing atmosphere to prepare europium-activated orthosilicate as a precursor; and
    secondarily firing a mixture of the precursor, $Si_3N_4$, and $NH_4Cl$ under a reducing atmosphere.

17. The white light emitting device according to claim 5, wherein the phosphor is obtained by:
    primarily firing a mixture of $SrCO_3$, $BaCO_3$, $SiO_2$, and $Eu_2O_3$ under a reducing atmosphere to prepare europium-activated orthosilicate as a precursor; and
    secondarily firing a mixture of the precursor, $Si_3N_4$, and $NH_4Cl$ under a reducing atmosphere.

18. The white light emitting device according to claim 6, wherein the phosphor is obtained by:
    primarily firing a mixture of $SrCO_3$, $BaCO_3$, $SiO_2$, and $Eu_2O_3$ under a reducing atmosphere to prepare europium-activated orthosilicate as a precursor; and
    secondarily firing a mixture of the precursor, $Si_3N_4$, and $NH_4Cl$ under a reducing atmosphere.

* * * * *